United States Patent [19]

Hasegawa et al.

[11] Patent Number: 5,317,836

[45] Date of Patent: Jun. 7, 1994

[54] APPARATUS FOR POLISHING CHAMFERS OF A WAFER

[75] Inventors: Fumihiko Hasegawa, Urawa; Masayuki Yamada, Shirakawa; Hiroshi Kawano; Tatsuo Ohtani, both of Fukushima, all of Japan

[73] Assignee: Shin-Etsu Handotai Co., Ltd., Japan

[21] Appl. No.: 980,358

[22] Filed: Nov. 23, 1992

[30] Foreign Application Priority Data

Nov. 27, 1991 [JP] Japan .................................. 3-335955

[51] Int. Cl.$^5$ ............................................. B24B 9/06
[52] U.S. Cl. ................................. 51/106 R; 51/283 E
[58] Field of Search ............ 51/283 E, 284 E, 106 R, 51/104, 106 LG

[56] References Cited

U.S. PATENT DOCUMENTS

| 1,268,974 | 6/1918 | Hoppes | 51/106 R |
| 4,344,260 | 8/1982 | Ogiwara | 51/283 E |
| 5,185,959 | 2/1993 | Ikola et al. | 51/283 E |

FOREIGN PATENT DOCUMENTS

| 1542785 | 2/1990 | U.S.S.R. | 51/283 E |
| 2126008 | 3/1984 | United Kingdom | 51/283 E |

Primary Examiner—Robert A. Rose
Attorney, Agent, or Firm—Whitham & Marhoefer

[57] ABSTRACT

An apparatus for polishing edge chamfers of a semiconductor wafer to mirror gloss, having a rotatory cylindrical buff formed with annular groove(s) in its side and a wafer vacuum holder capable of holding and turning the wafer circumferentially, wherein the cylindrical buff is adapted to shift axially, and the annular groove has a width substantially greater than the thickness of the wafer, and a drive mechanism for axially biasing the cylindrical buff is provided.

14 Claims, 6 Drawing Sheets

Fig. 3

APPARATUS FOR POLISHING CHAMFERS OF A WAFER

BACKGROUND OF THE INVENTION

The present invention relates to an apparatus for polishing (rounding) edge chamfers of a semiconductor wafer by pressing the edge of the wafer being circumferentially rotated to an annular groove made in the side of a cylindrical buff also being rotated in the same direction.

DESCRIPTION OF THE PRIOR ART

The semiconductor wafers from which the substrates for semiconductor devices are made are obtained from single crystal ingots such as silicon, by slicing the ingot in a direction substantially normal to the axis of the ingot. The wafers are, then, chamferred, lapped, etched, annealed, and polished.

In order to prevent chipping of the peripheral edge, the entire edge of a semiconductor wafer is chamferred to have a polygonal or a rounded thicknesswise profile, and the recent tendency is to polish the chamfers until they have specular gloss with a view to reducing the chances of particle generation and to preventing slippage of the wafer at the time of its thermal treatment.

Conventionally, the specular polishing of the chamfers of a wafer is effected by means of a polishing apparatus as shown in FIG. 6, wherein the side surface of the horizontal buff 104 made of a hard urethane resin is formed with horizontal annular grooves 105 having such profile that the chamferred edge Wa of the wafer W fits exactly in each of the grooves, and this buff 104 is turned at a predetermined rate by means of its shaft 121. The wafer W is horizontally held by a vacuum chuck 122, and as the vacuum chuck 122 itself is turned at a predetermined rate by means of its shaft 123 in the same direction as the shaft 121, as indicated by the curled arrows, the wafer W also turns. Then, while pouring a slurry 118 of a polishing powder (polishing fluid) on the chamferred edge Wa of the wafer W by means of a nozzle 117, the chamferred edge Wa is pressed into a groove 105 of the buff 104 in the direction indicated by the arrow f, whereupon the groove 105 and the wafer edge Wa, which are running counter to each other, rub against each other to effect polishing of the chamfers of the wafer edge Wa. This polishing is continued for a predetermined time length sufficient for the chamfers to have specular gloss.

PROBLEMS THE INVENTION SEEKS TO SOLVE

However, in reality the shape of the profile of chamferred edge Wa differs from wafer to wafer, so that the chances are that the chamferred edge does not exactly tally with the groove 105 of the buff 104; therefore, when such a wafer W is polished with the conventional apparatus wherein the chamferred edge Wa is pressed to fit in a groove 105 of the buff 104 to have all of its chamfers simultaneously polished, the chamfers fail to be uniformly polished and some portions of the chamfers may not be polished at all. Also, since the wafer is pressed into the groove 105 only in a horizontal direction (i.e., toward the axis of rotation of the buff 104), the chamfers at the upper and lower comers of the wafer edge are not sufficiently pressed against the groove surface and, as the result, the specular polishing was not effected. Furthermore, if the wafer is bowed or warped, the polishing fails to be uniform.

The present invention was contrived in view of the above problem, and it is, therefore, an object of the invention to provide an apparatus for polishing edge chamfers of a semiconductor wafer which can polish the chamfers of the wafer edge uniformly and without leaving any portion unpolished.

MEANS TO SOLVE THE PROBLEMS

In order to attain the above and other objects of the invention, there is provided an improved apparatus for polishing edge chamfers of a semiconductor wafer, which includes a rotatory cylindrical buff formed with at least one annular groove in its side describing a circle normal to the axis of the cylindrical buff and a wafer holder capable of holding and turning the wafer about an axis, the axis of rotation of the wafer being parallel to that of the buff, and the chamfer polishing being effected by pressing the edge of the wafer being circumferentially rotated into one of the annular grooves of the buff also being rotated about its axis in the same direction as the wafer whereby the annular groove runs counter to the running edge of the wafer; the improvement comprises that the cylindrical buff is adapted to freely shift axially, that the annular groove has a width substantially greater than the thickness of the wafer, and that the apparatus further comprises a means for axially biasing the cylindrical buff.

In a preferred embodiment, the buff is fitted via spline on an output shaft of a buff drive motor so that the buff is freely shiftable axially along the output shaft, and the axially biasing means comprises:

a buff support case (8) for supporting the buff in a manner such that the buff is freely rotatory as well as axially shiftable, guide shafts (9) for guiding the buff support case in the direction parallel to the buff axis, a spring seat provided inside the buff support case and supported by the guide shafts in a manner such that the spring seat is freely shiftable in the direction parallel to the buff axis and independently of the buff support case, a pair of springs, one compressed between the spring seat and the ceiling of the buff support case and the other compressed between the spring seat and the floor of the buff support case, and a means for shifting the spring seat in the direction parallel to the buff axis.

In a more preferred embodiment, a non-contact type displacement gauge is provided in the buff support case for detecting the displacement direction and amount of the spring seat and a control means is provided to adjust the position of the spring seat in a manner such that the force with which the buff is biased is maintained at a predetermined value.

EFFECTS

According to the invention, the cylindrical buff is adapted to shift axially, and the annular groove of the buff has a width substantially greater than the thickness of the wafer, so that it is possible to polish the edge chamfer of the wafer by three steps: namely polishing of the vertical portion of the chamfer, that of the upper corner of the chamfer and that of the lower corner of the chamfer. In polishing the upper and lower corners of the wafer chamfer, a constant axial force is exerted upon the buff by means of the axially biasing means so that even if the wafer is bowed or warped, one of the curved banks of the groove of the buff always presses itself on either corner of the wafer chamfer. As the result, the wafer chamfer is entirely and uniformly polished, and no part of the upper or lower corner is left unpolished, and thus it is possible to obtain wafers W of high quality stably.

Also, with the apparatus of the present invention, a highly efficient polishing operation is attained and it is, therefore, possible to secure as high productivity as is practiced by the conventional apparatus wherein the annular grooves made in the side surface of the buff have such profile that the chamferred edge of the wafer W fits exactly in each of the grooves.

The above and other objects and features of the invention will appear more fully hereinafter in the following description given in connection with the accompanying drawings and the novelty thereof pointed out in the appended claims.

BRIEF DESCRIPTION OF THE DRAWINGS

FIG. 3 is a sectional side elevation of the wafer chamfer polishing apparatus according to the first embodiment showing its operation;

EMBODIMENTS

Next, embodiments of the invention will be described with reference to the attached drawings.

Figure 1:
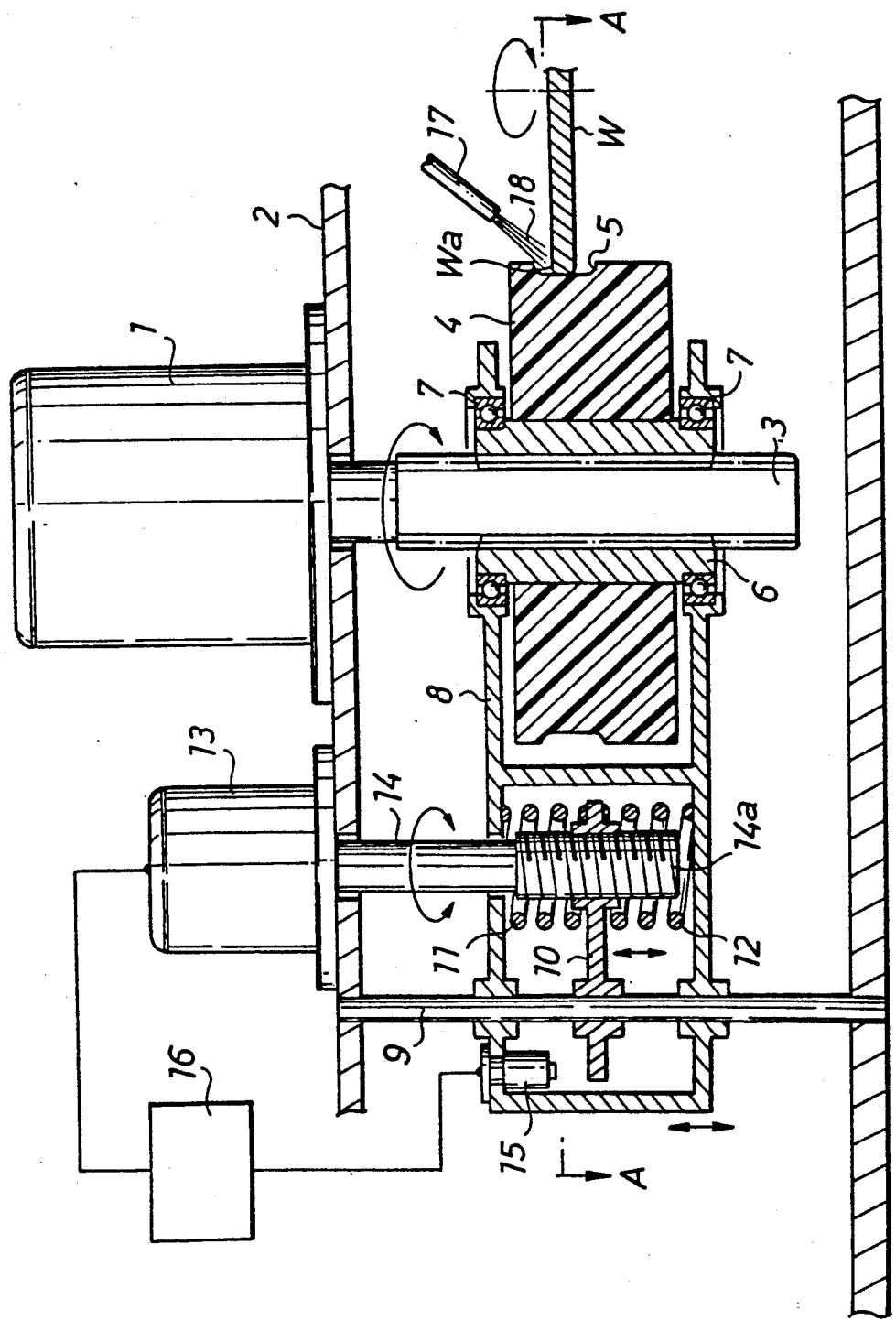
FIG. 1 is a sectional side elevation of a wafer chamfer polishing apparatus according to a first embodiment of the invention.
Figure 2:
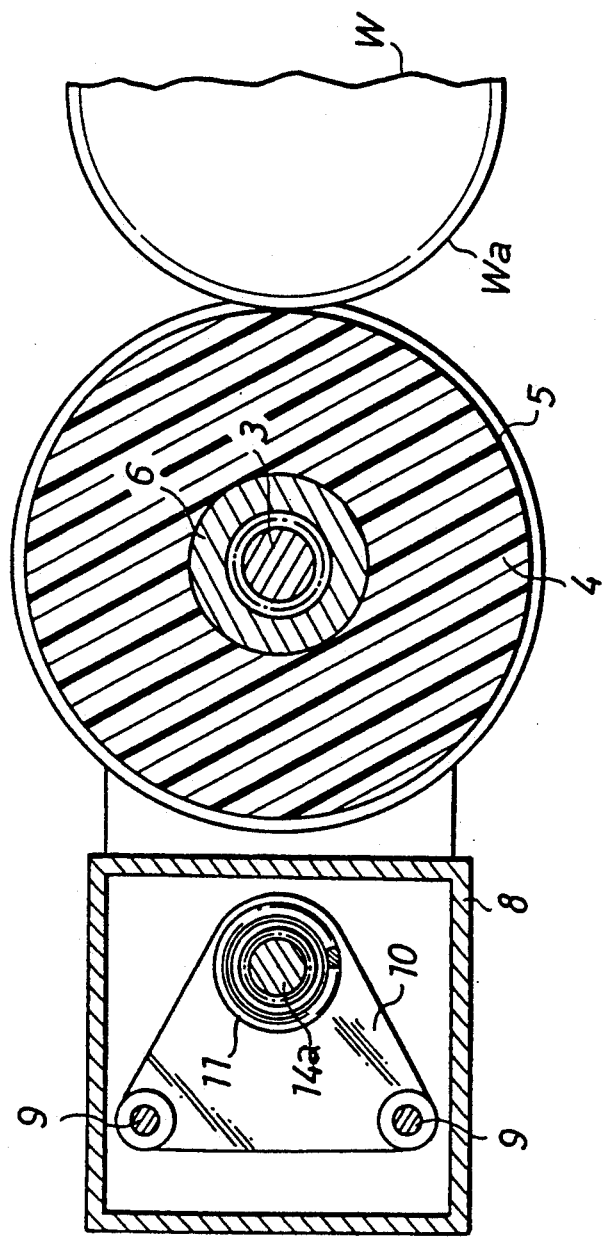
FIG. 2 is a cross section taken on line A—A of FIG. 1.
Figure 3:
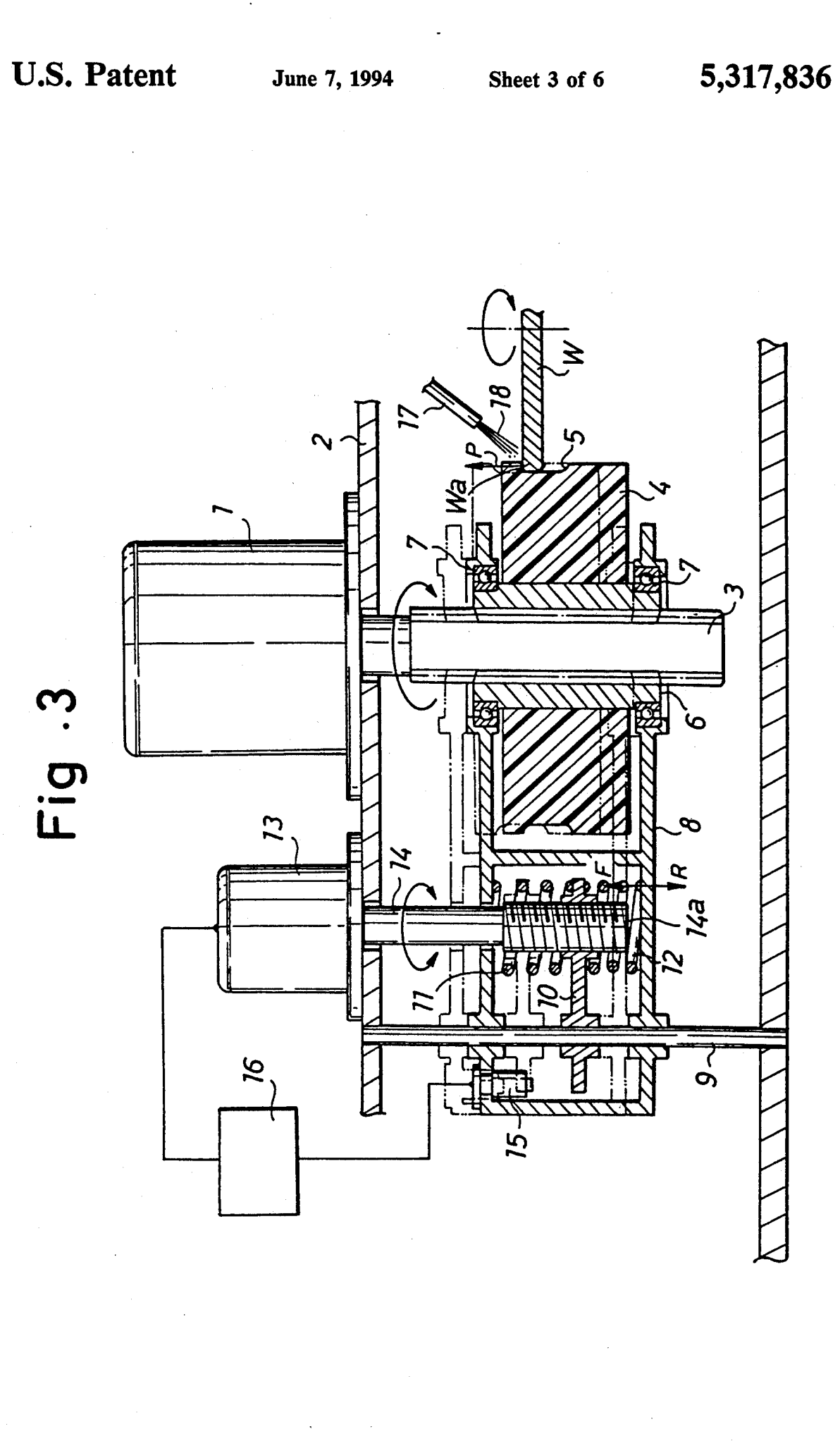

FIG. 1 is a sectional side elevation of a wafer chamfer polishing apparatus according to a first embodiment of the invention; FIG. 2 is a cross section taken on line A—A of FIG. 1; and FIG. 3 is a sectional side elevation of the wafer chamfer polishing apparatus according to the first embodiment showing its operation.

In FIG. 1, the reference numeral 1 designates a motor mounted on the roof plate of a housing 2 for driving a buff 4 to turn, and the buff 4 is fitted via spline about the output shaft 3 extending vertically from the buff drive motor 1. Therefore, the buff 4 is capable of freely shifting vertically (in the axial direction of the shaft 3), as well as turning circumferentially together with the output shaft 3.

The buff 4 is of a cylindrical shape and made of a hard urethane resin. An annular groove 5 having a width substantially greater than the thickness of a wafer W is made in the side of the cylindrical buff 4. A sleeve 6 having internal spline teeth is inserted in the middle of the buff 4, and the buff 4 is supported by a buff case 8 via the sleeve 6 and upper and lower bearing units 7 in a manner such that the buff 4 can rotate freely. Incidentally, the wafer W has its lower face sucked by a vacuum chuck, not shown, and thus held horizontally, and the vacuum chuck is adapted to turn the wafer W circumferentially at a predetermined rate by means of a motor, not shown.

Two vertical guide shafts 9 are erected extending from the floor to the roof plate of the housing 2 (ref. FIG. 2), and the buff case 8 is penetrated and supported by the two guide shafts 9 such that the buff case 8 is freely slidable along the shafts 9. Also in the buff case 8 is housed a spring seat 10 having a rounded triangular shape (ref. FIG. 2) in a manner such that the spring seat 10 is penetrated by, and freely slidable along, the guide shafts 9; springs 11 and 12 are compressed, respectively, between the roof plate of the buff case 8 and the spring seat 10 and between the floor of the buff case 8 and the spring seat 10, respectively.

Also, a motor 13 is fixed on the roof plate of the housing 2 for creating a force in the axial direction of the shafts 9, and the output shaft 14 of the motor 13 extends vertically downward and terminates in the buff case 8. The lower end portion of the output shaft 14 which is inside the buff case 8 constitutes a ball screw 14a, which threadably penetrates the spring seat 10, as shown in FIG. 1.

Thus, the buff case 8, the spring seat 10, springs 11, 12, the motor 13, etc. cooperate to constitute a mechanism for creating axial force on the buff 4; and as will be described later, by virtue of this mechanism for creating axial force, the buff 4 is axially biased by a controlled force. Also, the ball screw 14a and the motor 13 for driving the ball screw 14a cooperate to constitute a ball screw mechanism, by means of which the spring seat 10 is caused to shift vertically along the guide shafts 9.

Incidentally, as shown in FIG. 1, a non-contact type displacement gauge 15 is attached to the roof plate of the buff case 8 for detecting the vertical displacement of the spring seat 10, and the displacement amount of the spring seat 10 detected by the non-contact type displacement gauge 15 is inputted to a controller 16 (control means), and by means of this controller 16 the rotation of the motor 13 for creating the axial force is controlled so as to control the magnitude and direction of the axial force.

Also, as shown in FIG. 1, during the chamfer polishing operation a nozzle 17 directed toward the groove 5 is kept supplying slurry 18 to the position where the buff 4 and the wafer W are in contact.

Next, the operation of a wafer chamfer polishing apparatus according to the invention will be described.

In the above embodiment of the invention, the chamfer Wa of the wafer W is polished by three steps: namely polishing of the vertical portion of the chamfer, that of the upper corner of the chamfer and that of the lower corner of the chamfer.

First, in order to polish the vertical portion of the chamfer Wa of the wafer W, the spring seat 10 is maintained at the neutral position in the buff case 8, as shown in FIG. 1, whereby no axial force is imposed on the buff 4, and as the result the buff stays at its neutral position and the vertical portion of the wafer chamfer Wa contacts the flat bottom of the groove 5 of the buff 4. Then, the wafer W is driven to turn at a predetermined rate, and simultaneously as this the buff 4 is driven to turn in the same direction as the wafer W at a predetermined rate by means of the buff motor 1 and the slurry 18 is supplied from the nozzle 17; whereupon there occurs rubbing between the flat bottom of the groove 5 and the vertical portion of the wafer chamfer Wa and thus the vertical portion of the wafer chamfer Wa is polished to mirror gloss.

Next, in order to polish the the upper corner of the wafer chamfer Wa, the motor 13 for creating the axial force is operated to drive the ball screw 14a to turn in the direction such that the spring seat 10 threadably engaged with the ball screw 14 is caused to descend guided by the guide shaft 9 to assume a position as shown in solid line in FIG. 3; as the spring seat 10 presses the spring 12 downward the buff case 8 and hence the buff 4 are forced to shift downward till the upper corner of the wafer chamfer Wa contacts the upper curved bank of the groove 5 of the buff 4. From the moment the upper corner of the wafer chamfer Wa comes in contact with the upper curved bank of the groove 5, the spring seat 10 is lowered by a further distance of ΔX whereby, since the buff 4 and the buff case 8 holding the buff 4 are prevented by the wafer W from shifting downward any further, the lower spring 12 is compressed further by ΔX and as the result the spring 12 acquires an elastic force F of the magnitude of K·ΔX (k is the spring constant of the spring 12); consequently, a downward reaction force R having the magnitude of F is imposed on the buff case 8, supposing that the weight of the buff case 8 and the friction are null. This reaction force R is imparted to the buff 4 as a downward axial force, and this axial force creates an upward stress (rubbing force) P having the magnitude of F at the upper corner of the wafer chamfer Wa.

Then, similarly as above, the buff 4 and the wafer W are driven to turn at the predetermined rates and the slurry 18 is supplied from the nozzle 17; whereupon the upper corner of the wafer chamfer Wa is pressed on the upper curved bank of the annular groove 5 of the buff 4 with the force of P; as the result, there occurs rubbing between the wafer W and the buff 4, and thus the upper corner of the wafer chamfer Wa is polished to mirror gloss. During this operation, a fixed axial force is always imparted to the buff 4 by means of the axial force creating mechanism so that even if the wafer W is bowed or warped like an old record and the periphery of the turning wafer W undulates roughly, the upper curved bank of the groove 5 of the buff 4 not only maintains its contact with the upper corner of the wafer chamfer Wa but also keeps rubbing the latter with pressure, like a needle on the undulating old record. As the result, the upper corner of the wafer chamfer Wa is entirely and uniformly polished, and no part of the upper corner is left unpolished.

Incidentally, as described above, the vertical displacement of the spring seat 10 is detected by the non-contact type displacement gauge 15, and the detected value of the displacement is inputted in the controller 16 wherein the axial force being imposed on the buff 4 is calculated from the inputted displacement value. Then, if the calculated value of the axial force is unequal to a predetermined value, the rotation of the axial force creating motor 13 is controlled by means of the controller 16 to adjust the position of the spring seat 10 in a manner such that the axial force becomes equal to the predetermined value.

Finally, in order to polish the the lower corner of the wafer chamfer Wa, the motor 13 is operated to drive the ball screw 14a to turn in the opposite direction so that the spring seat 10 is caused to ascend along the guide shaft 9 to assume a position as shown in two-dot chain line in FIG. 3. As the spring seat 10 presses the spring 11 upward the buff case 8 together with the buff 4 are forced to shift upward till the lower corner of the wafer chamfer Wa contacts the lower curved bank of the groove 5 of the buff 4. From the moment the lower corner of the wafer chamfer Wa comes in contact with the lower curved bank of the groove 5, the spring seat 10 is raised by a further distance of ΔX' whereby, since the buff 4 and the buff case 8 holding the buff 4 are prevented by the wafer W from shifting upward any further, the upper spring 11 is compressed further by ΔX' and as the result the spring 11 acquires an elastic force F' of the magnitude of k'·ΔX' (k' is the spring constant of the spring 11); similarly as the preceding case, an upward axial force is imparted to the buff 4, and this axial force creates a downward stress (rubbing force) P' having the magnitude of F' at the lower corner of the wafer chamfer Wa.

Then, similarly as above, the buff 4 and the wafer W are driven to turn at the predetermined rates and the slurry 18 is supplied from the nozzle 17; whereupon the lower corner of the wafer chamfer Wa is pressed on the lower curved bank of the annular groove 5 of the buff 4 with the force of P'; as the result, there occurs rubbing between the wafer W and the buff 4, and thus the lower corner of the wafer chamfer Wa is polished to mirror gloss. During this operation also, a fixed axial force is always imparted to the buff 4 by means of the axial force creating mechanism so that even if the wafer W is bowed or warped and the periphery of the turning wafer W undulates roughly, the lower curved bank of the groove 5 of the buff 4 not only maintains its contact with the lower corner of the wafer chamfer Wa but also keeps rubbing the latter with pressure. As the result, the lower corner of the wafer chamfer Wa is entirely and uniformly polished, and no part of the lower corner is left unpolished.

Incidentally, in this case also, the vertical displacement of the spring seat 10 is detected by the non-contact type displacement gauge 15, and in the similar manner as above, the rotation of the axial force creating motor 13 is controlled by means of the controller 16 to adjust the position of the spring seat 10 in a manner such that the axial force becomes equal to the predetermined value.

As described above, in this embodiment, the chamfer Wa of the wafer W is polished by three steps, namely polishing of the vertical portion of the chamfer, that of the upper corner of the chamfer and that of the lower corner of the chamfer; especially at the latter two steps of polishing the upper and lower corners of the wafer chamfer Wa, respectively, a constant axial force is exerted upon the buff 4 by means of the axial force creating mechanism so that even if the wafer W is bowed or warped, one of the curved banks of the groove 5 of the buff 4 always presses itself on either corner of the wafer chamfer Wa. As the result, the wafer chamfer Wa is entirely and uniformly polished, and no part of the upper or lower corner is left unpolished, and thus it is possible to obtain wafers W of high quality stably.

Also, by the apparatus of the present invention, a highly efficient polishing operation is attained and it is, therefore, possible to secure as high productivity as is practiced by the conventional apparatus wherein the annular grooves made in the side surface of the buff have such profile that the chamferred edge of the wafer W fits exactly in each of the grooves.

Figure 4:
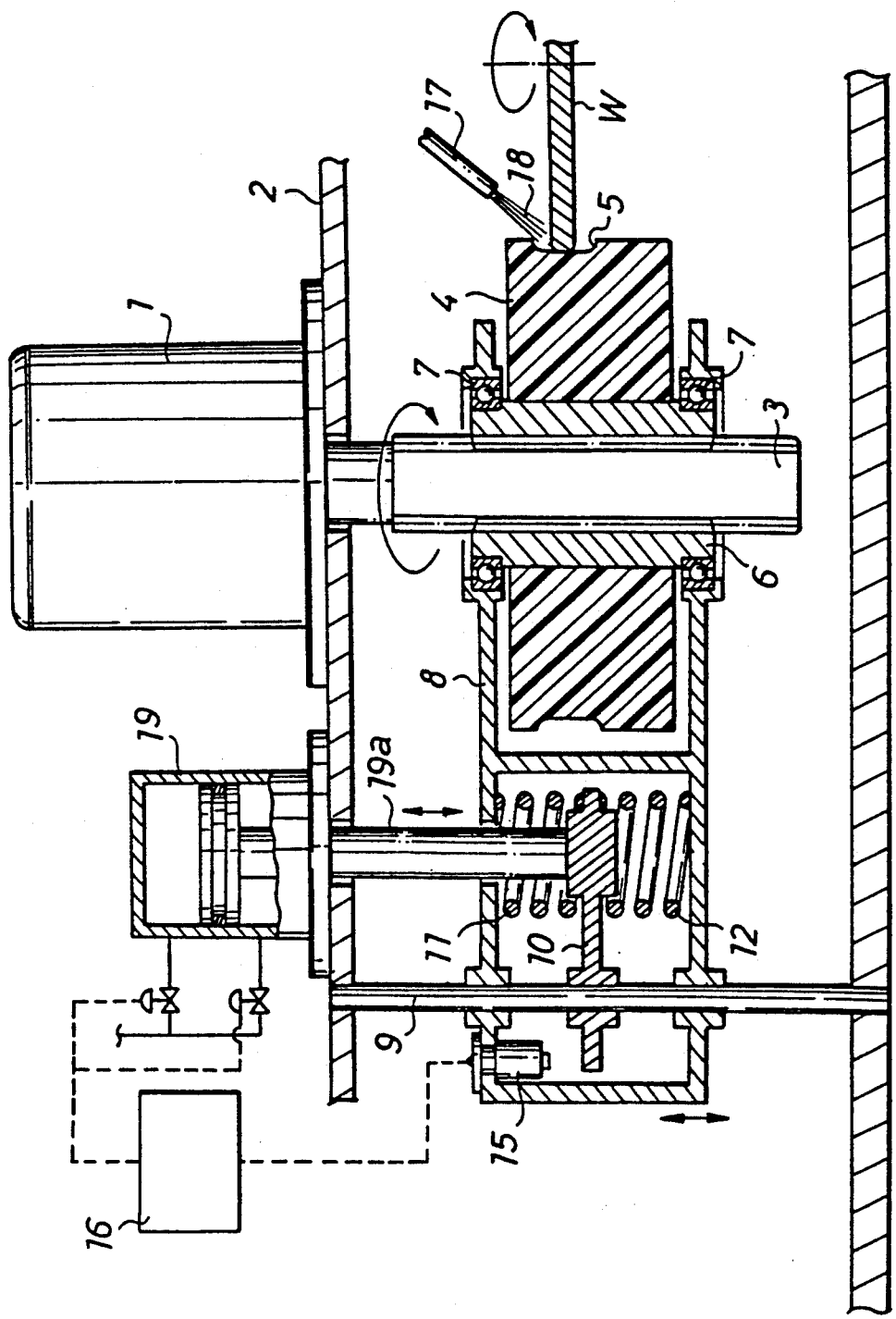
FIG. 4 is a sectional side elevation of a wafer chamfer polishing apparatus according to a second embodiment of the invention.

Incidentally, in the above embodiment, a ball screw mechanism consisting of the ball screw 14a and the motor 13 is employed as the means for displacing the spring seat 10; however, it is equally effective if the screw mechanism is substituted by an air cylinder such as the one (19) shown in FIG. 4, wherein the rod 19a of the air cylinder 19 is directly connected to the spring seat 10. In FIG. 4, incidentally, those elements that also appears in FIG. 1 are given the same reference numerals.

Figure 5:
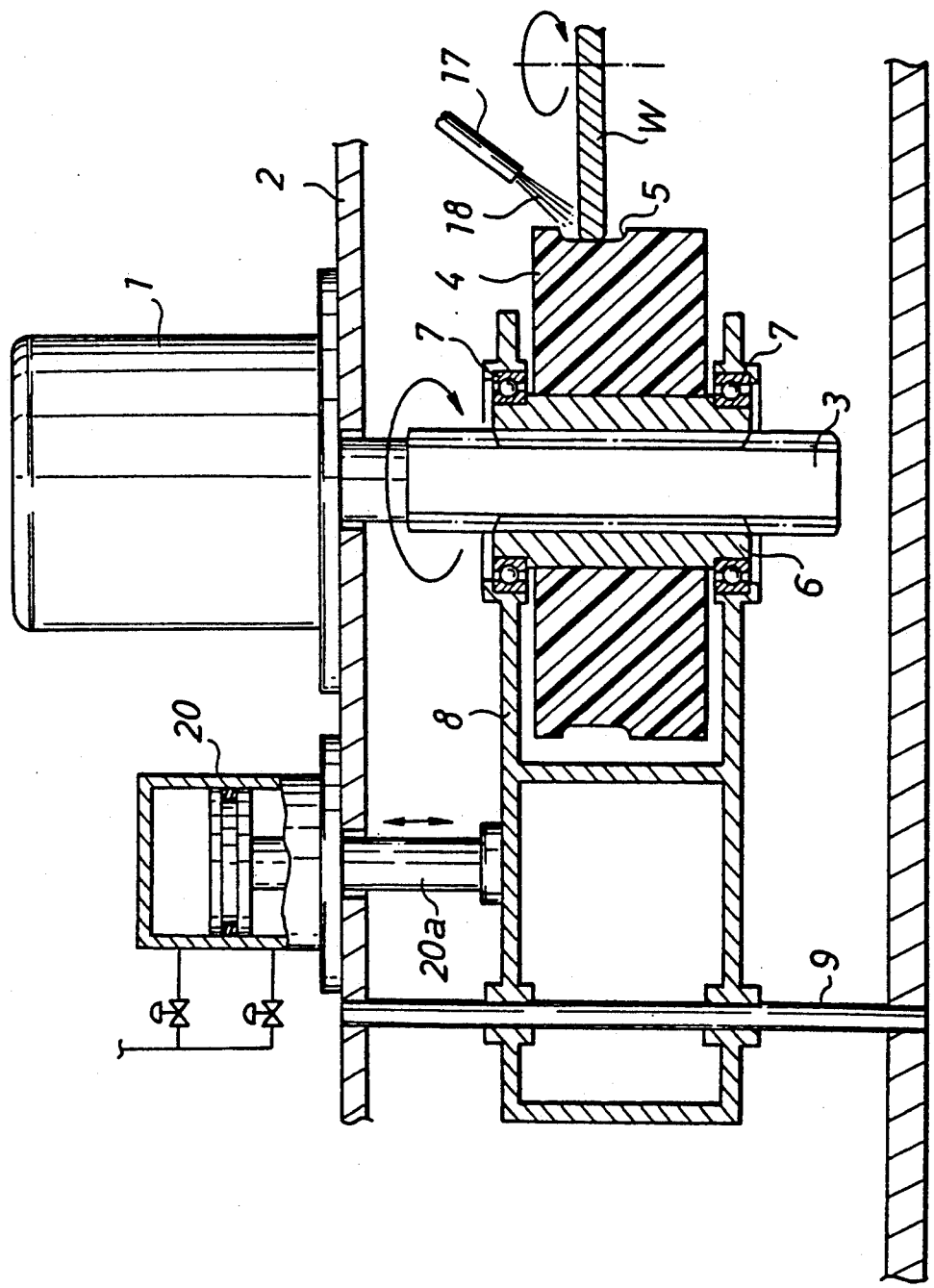
FIG. 5 is a sectional side elevation of a wafer chamfer polishing apparatus according to a third embodiment of the invention.
Figure 6:
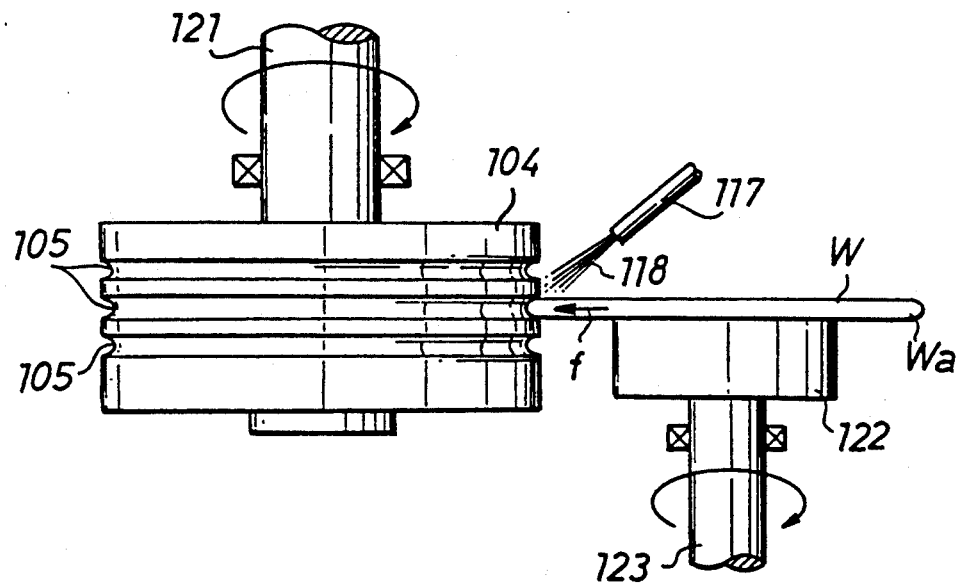
FIG. 6 is a side view of a conventional wafer chamfer polishing apparatus.

Furthermore, as the axial force creating mechanism, it is possible to adopt the one as shown in FIG. 5, wherein the rod 20a of the air cylinder 20 is directly connected to the buff case 8. In this construction, the role played by the springs 11, 12 of the first embodiment (ref. FIG. 1) is taken over by the air in the air cylinder 20. In FIG. 5, those elements that also appear in FIG. 1 are given the same reference numerals.

Obviously many modifications and variations of the present invention are possible in the light of the above teachings. It is therefore to be understood that within the scope of the appended claims the invention may be practiced otherwise than is specifically described.

What is claimed is:

1. An apparatus for polishing edge chamfers of a semiconductor wafer including
    a rotatory cylindrical buff with at least one annular groove in its side, said groove having a width substantially greater than the thickness of the wafer and describing a circle normal to the axis of the cylindrical buff;
    a wafer holder capable of holding and turning the wafer about an axis, the axis of rotation of the wafer being parallel to that of said buff whereby the chamfer polishing is effected by pressing the edge of the wafer, being circumferentially rotated, into said at least one annular groove of the buff, said buff also being rotated about its axis in the same direction as the wafer whereby the annular groove runs counter to the running edge of the wafer;
    means for supporting said cylindrical buff to freely shift axially;
    means for axially biasing said cylindrical buff;
    wherein said buff is fitted via spline on an output shaft of a buff drive motor so that the buff is freely shiftable axially along said output shaft, and
    said means for supporting said cylindrical buff comprises:
    a buff support case (8) for supporting said buff in a manner such that the buff is freely rotatory as well as axially shiftable,
    guide shafts (9) for guiding said buff support case in the direction parallel to the buff axis, and
    said means for controllably biasing said cylindrical buff comprises:
    a spring seat provided inside said buff support case and supported by said guide shafts in a manner such that the spring seat is freely shiftable in the direction parallel to the buff axis and independently of the buff support case,
    a pair of springs, one compressed between said spring seat and a ceiling of said buff support case and the other compressed between said spring seat and a floor of said buff support case, and
    a means for shifting said spring seat in the direction parallel to the buff axis.

2. The improved apparatus as claimed in claim 1 wherein said means for shifting the spring seat is a ball screw mechanism consisting of a ball screw extending parallel to said guide shafts and threaded through said spring seat and a motor for driving said ball screw to turn.

3. The improved apparatus as claimed in claim 1 wherein said means for shifting the spring seat comprises an air cylinder (19) having a rod connected to said spring seat.

4. The improved apparatus as claimed in claim 2 wherein a non-contact type displacement gauge is provided in said buff support case for detecting the displacement direction and amount of the spring seat and a control means is provided to adjust the position of the spring seat in a manner such that the force with which the buff is biased is maintained at a predetermined value.

5. An apparatus for polishing edge chamfers of a semiconductor wafer including
    a rotatory cylindrical buff with at least one annular groove in its side, said groove having a width substantially greater than the thickness of the wafer and describing a circle normal to the axis of the cylindrical buff;
    a wafer holder capable of holding and turning the wafer about an axis, the axis of rotation of the wafer being parallel to that of said buff whereby the chamfer polishing is effected by pressing the edge of the wafer, being circumferentially rotated, into said at least one annular groove of the buff, said buff also being rotated about its axis in the same direction as the wafer whereby the annular groove runs counter to the running edge of the wafer;
    means for supporting said cylindrical buff to freely shift axially;
    means for axially biasing said cylindrical buff;
    wherein said buff is fitted via spline on an output shaft of a buff drive motor so that the buff is freely shiftable axially along said output shaft, and said means for supporting said cylindrical buff comprises:
    a buff support case (8) means for supporting said buff in a manner that the buff is freely rotatory as well as axially shiftable, and
    said means for axially biasing said cylindrical buff comprises:
    guide shafts (9) for guiding said buff support case in the direction parallel to the buff axis, and
    an air cylinder (20) having a rod directly connected to the buff support case for shifting said buff support case in the direction parallel to the buff axis.

6. The improved apparatus as claimed in claim 3 wherein a non-contact type displacement gauge is provided in said buff support case for detecting the displacement direction and amount of the spring seat and a control means is provided to adjust the position of the spring seat in a manner such that the force with which the buff is biased is maintained at a predetermined value.

7. An apparatus for polishing edge chamfers of a semiconductor wafer including
    a rotatory cylindrical buff with at least one annular groove in its side, said groove having a width substantially greater than the thickness of the wafer and describing a circle normal to the axis of the cylindrical buff,
    a wafer holder capable of holding and turning the wafer about an axis, the axis of rotation of the wafer being parallel to that of said buff whereby the chamfer polishing is effected by pressing the edge of the wafer, being circumferentially rotated, into said at least one annular groove of the buff, said buff also being rotated about its axis in the same direction as the wafer whereby the annular groove runs counter to the running edge of the wafer, means for supporting said cylindrical buff to freely shift axially, and means for controllably biasing said cylindrical buff elastically in either of two opposing axial directions.

8. An apparatus as claimed in claim 7 wherein said buff is fitted via spline on an output shaft of a buff driver motor so that the buff is freely shiftable axially along said output shaft, and said means for supporting said cylindrical buff comprises:

a buff support case (8) for supporting said buff in a manner such that the buff is freely rotatory as well as axially shiftable, and guide shafts (9) for guiding said buff support case in the direction parallel to the buff axis, and said means for controllably biasing said cylindrical buff comprises:

axial drive means, an axially shiftable means for receiving a positioning force from said axial drive means, and means for elastically transferring a force in the direction parallel to the buff axis from said axial drive means to said buff support case.

9. An apparatus as recited in claim 8, wherein said means for elastically transferring a force comprises a pair of springs, and said axially shiftable means comprises a spring seat for positioning said pair of springs.

10. An apparatus as recited in claim 9, wherein said spring seat is provided inside said buff support case and supported by guide shafts in a manner such that the spring seat is freely shiftable in the direction parallel to the buff axis and independently of the buff support case, and one of said pair of springs is compressed between said spring seat and a ceiling of said buff support case and the other of said pair of spring is compressed between said spring seat and a floor of said buff support case.

11. An apparatus as recited in claim 8, wherein said means for elastically transferring a force includes an air cylinder.

12. An apparatus as recited in claim 11, wherein said means for elastically transferring a force further includes a pair of springs, and a spring seat for positioning said pair of springs.

13. An apparatus as recited in claim 12, wherein said spring seat is provided inside said buff support case and supported by guide shafts in a manner such that the spring seat is freely shiftable in the direction parallel to the buff axis and independently of the buff support case, and wherein one of said pair of springs is compressed between said spring seat and a ceiling of said buff support case and the other of said pair of spring is compressed between said spring seat and a floor of said buff support case.

14. An apparatus as recited in claim 8, further including a non-contact type displacement gauge for detecting a displacement direction and distance of said axially shiftable means, and a control means for adjusting the position of said axially shiftable means to maintain said force in the direction of the buff axis at a substantially constant value.

* * * * *